United States Patent
Muchow et al.

(10) Patent No.: US 7,343,806 B2
(45) Date of Patent: Mar. 18, 2008

(54) PRESSURE SENSOR FEATURING PRESSURE LOADING OF THE FASTENING ELEMENT

(75) Inventors: Joerg Muchow, Reutlingen (DE); Hubert Benzel, Pliezhausen (DE); Heribert Weber, Nuertingen (DE); Frank Schaefer, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/539,526

(22) PCT Filed: Aug. 18, 2003

(86) PCT No.: PCT/DE03/02756

§ 371 (c)(1), (2), (4) Date: Feb. 7, 2006

(87) PCT Pub. No.: WO2004/057290

PCT Pub. Date: Jul. 8, 2004

(65) Prior Publication Data

US 2006/0162462 A1 Jul. 27, 2006

(30) Foreign Application Priority Data

Dec. 19, 2002 (DE) ................... 102 60 105

(51) Int. Cl.
*G01L 7/00* (2006.01)
(52) U.S. Cl. .......................... 73/715; 73/756
(58) Field of Classification Search ............ 73/727, 73/754, 756, 715
See application file for complete search history.

(56) References Cited

U.S. PATENT DOCUMENTS

| 4,939,497 A | * | 7/1990 | Nishida et al. ............... 338/4 |
| 5,090,247 A | * | 2/1992 | Liebgen ....................... 73/727 |
| 6,300,169 B1 | * | 10/2001 | Weiblen et al. .............. 438/127 |

FOREIGN PATENT DOCUMENTS

| DE | 39 13 031 | 10/1990 |
| DE | 100 14 634 | 10/2000 |
| DE | 199 29 026 | 12/2000 |
| EP | 0 427 261 | 5/1991 |
| EP | 0 488 446 | 6/1992 |
| EP | 0 735 353 | 10/1996 |
| FR | 2 786 564 | 6/2000 |
| JP | 61 132832 | 6/1986 |

OTHER PUBLICATIONS

E. Bose: "Fluid Pressur Transducers," Electronic Engineering, Bd. 53, Nr. 659, 1981, Seite 169, XP002029075, London (GB), Abbildung 1.

* cited by examiner

*Primary Examiner*—Andre J. Allen
(74) *Attorney, Agent, or Firm*—Kenyon & Kenyon LLP

(57) ABSTRACT

A pressure sensor having a pressure sensor element, the pressure sensor element having a diaphragm area and a first fixing area, the pressure to be measured exerting a force action on the diaphragm area, the first fixing area being connected to a second fixing area of a fixing element to fix the pressure sensor element, and the first fixing area and the second fixing area being pressure-loaded by the force action.

12 Claims, 3 Drawing Sheets

PRESSURE SENSOR FEATURING PRESSURE LOADING OF THE FASTENING ELEMENT

FIELD OF THE INVENTION

The present invention is directed to a pressure sensor.

BACKGROUND INFORMATION

Micromechanical silicon pressure sensors may have a diaphragm created by inserting a cavern into a silicon chip. Such a silicon sensor is discussed in Unexamined German Patent Application No. 199 57 556, for example. In this case, the cavern is created via anisotropic KOH etching for example.

SUMMARY OF THE INVENTION

The pressure sensor according to the exemplary embodiment of the present invention may have the advantage that a simple and cost-effective design is proposed for the manufacture of a pressure sensor. The pressure sensor according to the exemplary embodiment of the present invention is used in particular for measuring high pressures, the pressure sensor according to the exemplary embodiment of the present invention nonetheless exhibiting significant overload safety. Furthermore, it is also possible according to the exemplary embodiment of the present invention to use the pressure sensor for low pressures. The pressure sensor according to the exemplary embodiment of the present invention therefore has the advantage that cost-effective manufacture of a micromechanical sensor for low to high pressures (e.g., up to or over 1,000 bar) is possible. As a result, it is possible to cost-effectively provide a pressure sensor which is usable for a wide range of different pressures. This makes it possible to increase the quantities while further lowering costs. Moreover, the system according to the exemplary embodiment of the present invention makes it possible to separate the pressure medium and the analyzing circuit. It is particularly advantageous that the connections between the first and the second fixing area are only pressure-stressed. This means that the force action, which acts on the diaphragm area for measuring a pressure, has the effect that the first fixing area is pressed onto the second fixing area.

It may be particularly advantageous that semiconductor material and/or bulk micromechanics is/are used to manufacture the pressure sensor element, thereby making it possible to manufacture the pressure sensor element and thus the pressure sensor in a particularly cost-effective and reliable manner. Furthermore, it is an advantage that the pressure sensor is provided for high pressures up to approximately 1,000 bar or for high pressures exceeding 1,000 bar. Because of this and the usability in a wide pressure range, the pressure sensor is manufacturable particularly cost-effectively and in large quantities. Furthermore, it is an advantage that the fixing element, with respect to its coefficient of thermal expansion, is designed to be adapted to the sensor element. This makes it possible that, due to temperature fluctuations, only minor stresses are applied to the sensor element and that the pressure sensor is usable not only in a wide pressure range but also in a wide temperature range.

It may also be advantageous that a connecting material is provided between the first fixing area and the second fixing area, the connecting material being comparatively soft. As a result, mechanical stresses due to temperature fluctuations are also able to be effectively compensated for. Furthermore, it is an advantage that resistor elements are provided in the diaphragm area, thereby making it possible to measure pressures in wide pressure ranges via a simple arrangement and thus in a cost-effective manner. Furthermore, it is advantageous that the connecting surface between the first fixing area and the second fixing area is provided to be parallel or inclined, i.e., at an acute angle, with respect to the diaphragm plane, thereby resulting in manifold possibilities for varying the pressure sensor according to the exemplary embodiment of the present invention. It is also advantageous that the cross section of the fixing element tapers in the direction of the second fixing area. This makes it possible in a simple manner to assemble the sensor chip in a centered position.

DETAILED DESCRIPTION

Figure 1:
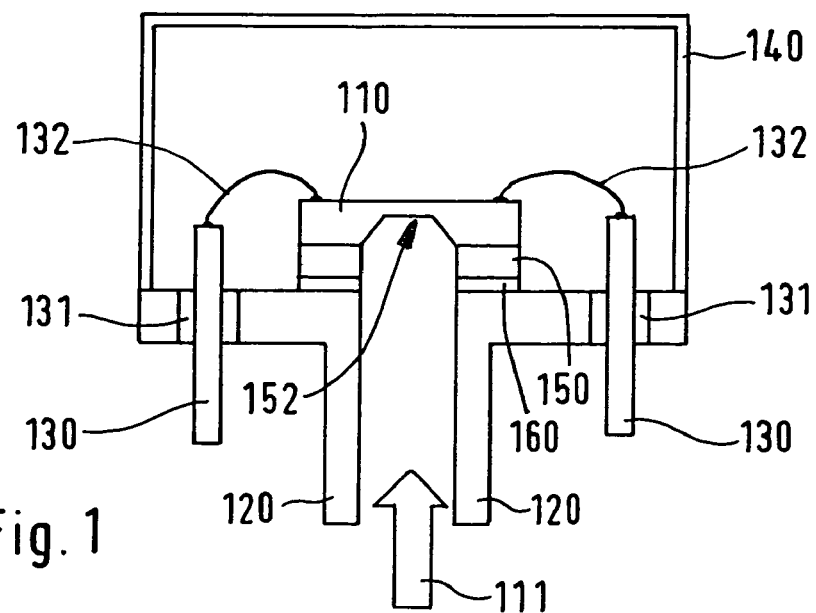
FIG. 1 shows a known micromechanical silicon pressure sensor according to the related art.

FIG. 1 shows the generally common design of micromechanical silicon pressure sensors. A silicon substrate 110 is provided with a cavern 152 which creates a diaphragm which is not indicated in detail by a reference numeral. Silicon substrate 110 is connected to a glass 150 which is provided with a bore and is soldered onto a socket 120 via a solder 160. Socket 120 as a single piece is connected to a pressure connecting piece. Furthermore, measuring shunts (not indicated in detail by a reference numeral), which are situated on the top side of silicon substrate 110, are connected to a terminal post 130 via one or multiple contact wires 132, the terminal posts being electrically isolated from socket 120 by a glass insulation 131. Cavern 152 of silicon substrate 110 has a typical etch bevel which has approximately the shape of the frustum of a pyramid. This results in a trapezoidal cross section.

This frustum of a pyramid-shaped recess underneath the sensor diaphragm results when a silicon substrate is used which has a (100)-orientation since KOH etching exhibits different etching rates in different crystal directions. It proves to be disadvantageous in the known pressure sensor that the frustum of a pyramid-shaped recess at its greatest cross section, i.e., at the backside of the silicon substrate, is essential as the pressure application surface. This results in great tensile forces acting on glass 150 and solder 160.

Consequently, the silicon sensor according to the related art has only a comparatively low burst pressure. Pressure sensors are frequently manufactured using bulk micromechanics and are anodically bonded on glass. For backside pressurization, the sensor is soldered onto a punched socket.

The glass and the connecting points silicon/glass and glass/solder/socket are heavily tension-loaded so that pressure loads over 100 bar are difficult to implement. Expensive design concepts are used for higher pressures, some of which use a metal diaphragm (e.g., a thin-layer on a metal diaphragm, micromechanical pressure sensor having an oil seal).

Figure 2:
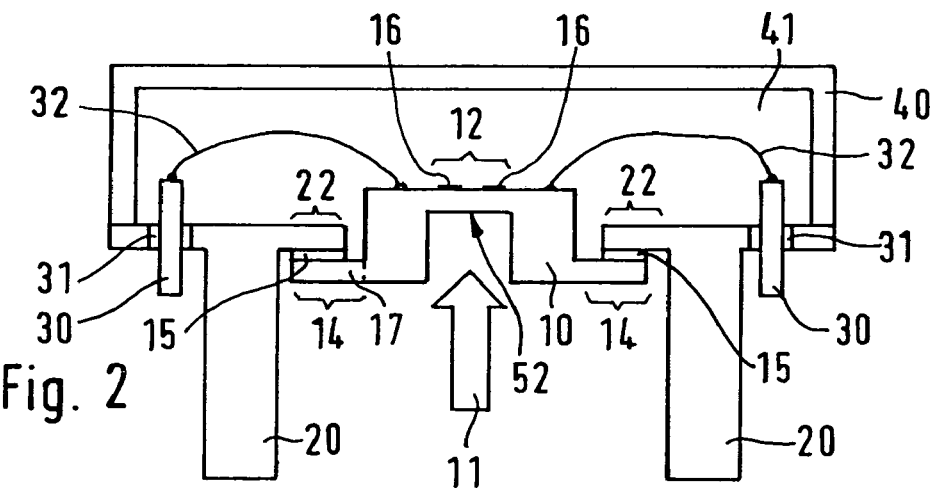
FIG. 2 shows a pressure sensor according to the exemplary embodiment of the present invention as an absolute pressure sensor.

FIG. 2 shows a pressure sensor according to the exemplary embodiment of the present invention. A pressure sensor element 10, which is made in particular of a semiconductor material and in particular of silicon, has a diaphragm area 12 on one front. On the backside of diaphragm area 12, an etched cavern 52 is created in pressure sensor element 10, the cavern being inserted into pressure sensor element 10 from the backside using a trench etching technique in particular. In FIG. 2, measuring shunts are indicated on diaphragm area 12 of pressure sensor element 10 by reference numeral 16 and are, however, not represented in the following figures for the sake of simplicity, but are to be kept in mind. In FIG. 2, pressure sensor element 10 has a fixing area 14 in the area of its backside which is referred to in the following as first fixing area 14. Pressure sensor chip 10, i.e., pressure sensor element 10, is manufactured in the embodiment shown in FIG. 2 in particular in such a way that is has lateral projections 17 via which it may be fixed in or on a socket 20. This type of fixing results in the fact that only pressure stresses occur during pressurization. The force exerted on pressure sensor element 10 due to the pressurization is depicted in FIG. 2 by an arrow and reference numeral 11.

For manufacturing the pressure sensor according to the exemplary embodiment of the present invention, pressure sensor element 10 is connected to socket 20, socket 20 also being referred to in the following as fixing element 20. Fixing element 20 also has a fixing area 22, in particular in the area of aforementioned projection 17, which is referred to in the following as second fixing area 22. A connecting material 15 is provided between first fixing area 14 and second fixing area 22. Solder (metal, glass) or adhesives may be used, for example, as connecting material 15. Socket 20 may be made of Kovar and is thus, with regard to its coefficient of thermal expansion, adapted to the coefficient of thermal expansion of the material of pressure sensor element 10, i.e., to silicon in particular. Since the socket material Kovar is poorly machinable, socket 20 may be manufactured using metal injection molding technology. Connecting material 15 may be relatively soft in order to absorb mechanical stresses during temperature changes.

FIG. 2 shows an embodiment of the pressure sensor according to the exemplary embodiment of the present invention as an absolute pressure sensor. A vacuum-tight cap 40 around the front of pressure sensor element 10 is provided in this case. In its lower part, socket 20 again includes a pressure connecting piece which is not indicated in detail with a reference numeral. Furthermore, measuring shunts 12, which are situated on the top side of pressure sensor element 10, are connected to one or multiple terminal post(s) 30 via one or multiple contact wires 32, the terminal posts being electrically isolated from socket 20 by a glass insulation 31. Cap 40 encloses a reference volume 41 which is provided in an evacuated manner, for example. The absolute pressure on the backside of pressure sensor element 10, i.e., the side of pressure sensor element 10 facing away from reference volume 41, may thus be measured.

Figure 3:
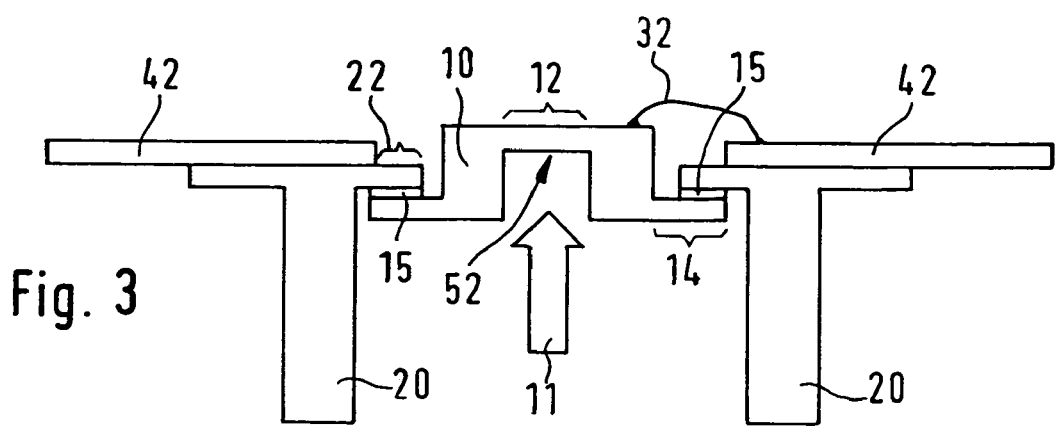
FIG. 3 shows a pressure sensor according to the exemplary embodiment of the present invention as a relative pressure sensor.

FIG. 3 shows a pressure sensor according to the exemplary embodiment of the present invention as a relative pressure sensor. Here again, pressure sensor element 10 is shown including its first fixing area 14 and its diaphragm area 12. Furthermore, socket 20 is shown including its second fixing area 22. Connecting material 15 between first and second fixing areas 14, 22 and pressure force 11 or force action 11 acting on pressure sensor element 10 are also shown. A printed board, indicated by reference numeral 42, is shown in FIG. 3. The electrical leads between printed board 42 and pressure sensor element 10 are implemented via contact wires 32. According to the exemplary embodiment of the present invention, printed board 42 may also be provided as hybrid 42.

Figure 4:
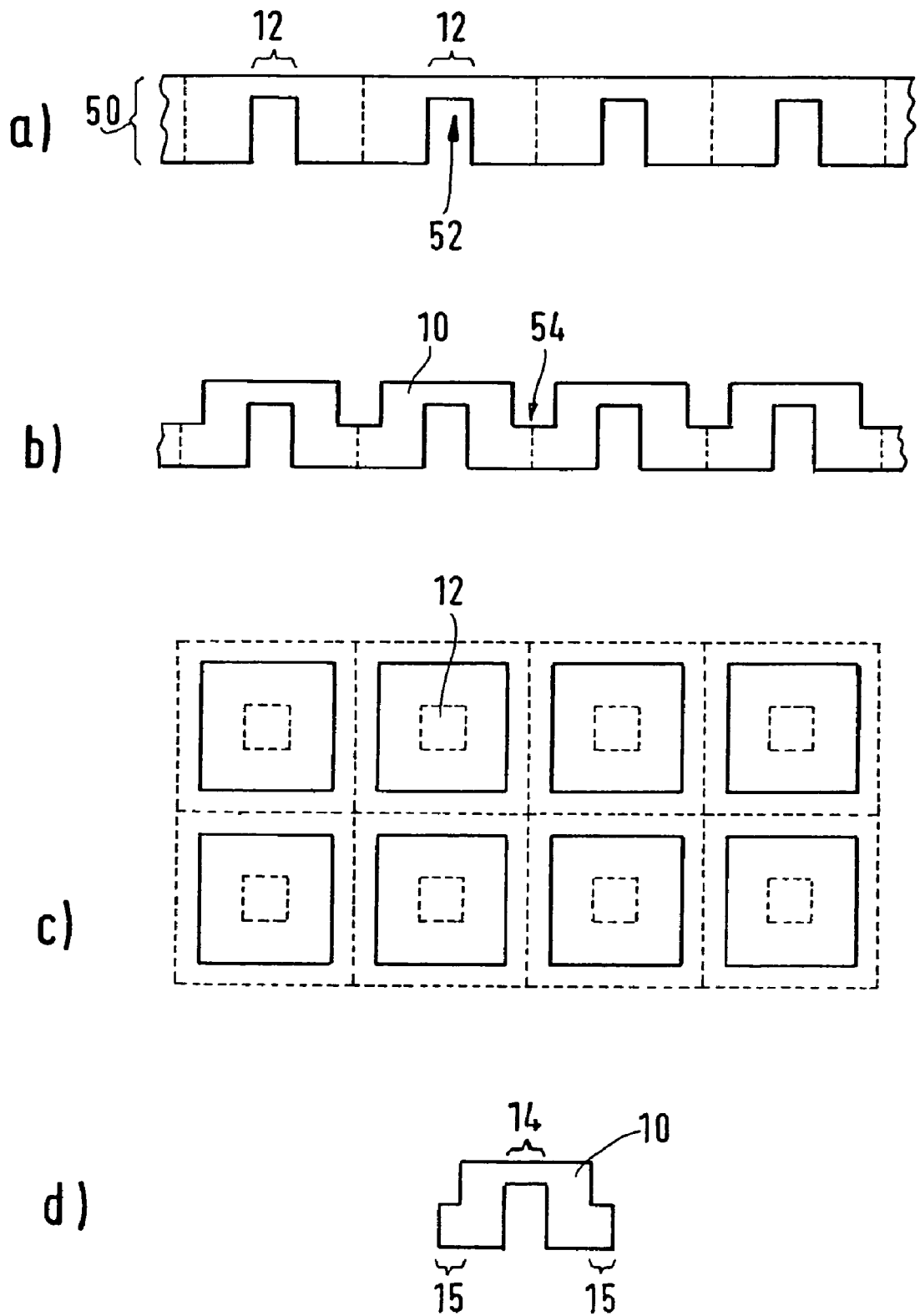
FIG. 4 shows different intermediate steps for manufacturing the sensor element.

Different intermediate steps for manufacturing sensor element 10 are shown in FIG. 4. A substrate 50, in particular a semiconductor substrate 50 as the material for sensor element 10, is processed according to known methods. In this case in particular, a cavern 52 is etched into the backside of future pressure sensor element 10 (see FIG. 4a). According to the exemplary embodiment of the present invention, a trench etching technique or, as explained in connection with FIG. 1, a KOH etching technique, is used in particular for this purpose. Due to etching of cavern 52, diaphragm area 12 is created in the area of the front of future pressure sensor element 10. In an exemplary embodiment of the present invention, piezoresistive resistors on the diaphragm and, if needed, additionally an integrated analyzing circuit in substrate 50 alongside the diaphragm are created on the front of future pressure sensor element 10 prior to etching of cavern 52. However, neither the resistors nor the analyzing circuit is shown in FIG. 4. A further step for manufacturing pressure sensor elements 10 is shown in FIG. 4b: notches 54 are implemented from the front.

FIG. 4a and FIG. 4b each represent a side view of pressure sensor element 10 according to the exemplary embodiment of the present invention along a cut through diaphragm area 12. According to the exemplary embodiment of the present invention, notches 54 are created in particular using etching techniques such as high-rate trench etching or sawing using a broad saw blade. The shape of the notches, such as square, round, etc., is freely selectable. FIG. 4c shows a top view of a number of future pressure sensor elements 10 prepared in this way, diaphragm area 12 being particularly prominent.

Subsequent to these preparatory steps, the still connected (see FIGS. 4a-4c) pressure sensor elements 10 are separated. This may be carried out by sawing using a very thin saw blade. Pressure sensor element 10, obtained in this way and also referred to in the following as pressure sensor chip 10 or sensor chip 10, may be assembled in a socket 20 as shown in FIGS. 2 and 3.

Figure 5:
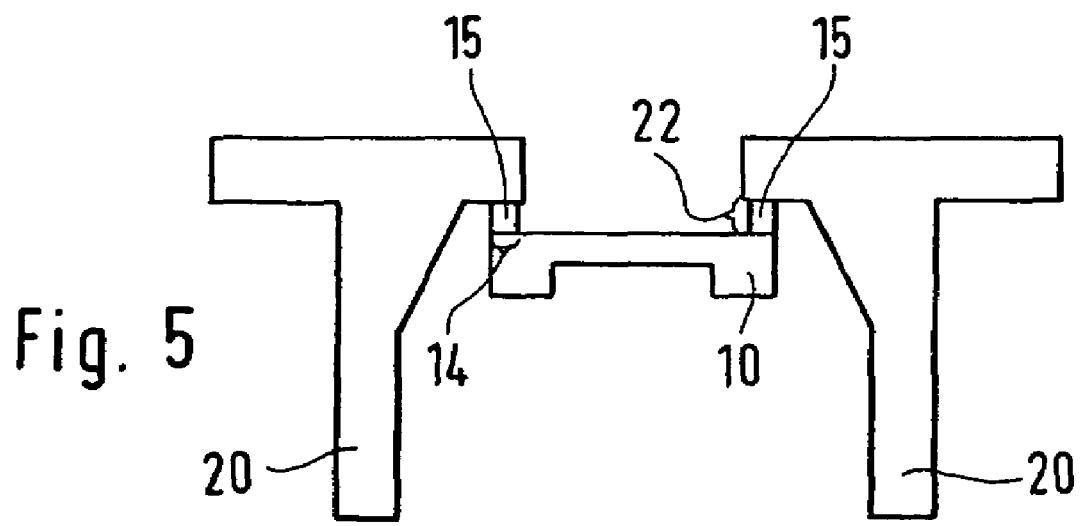
FIG. 5 shows a first design variant of the sensor according to the exemplary embodiment of the present invention.
Figure 6:
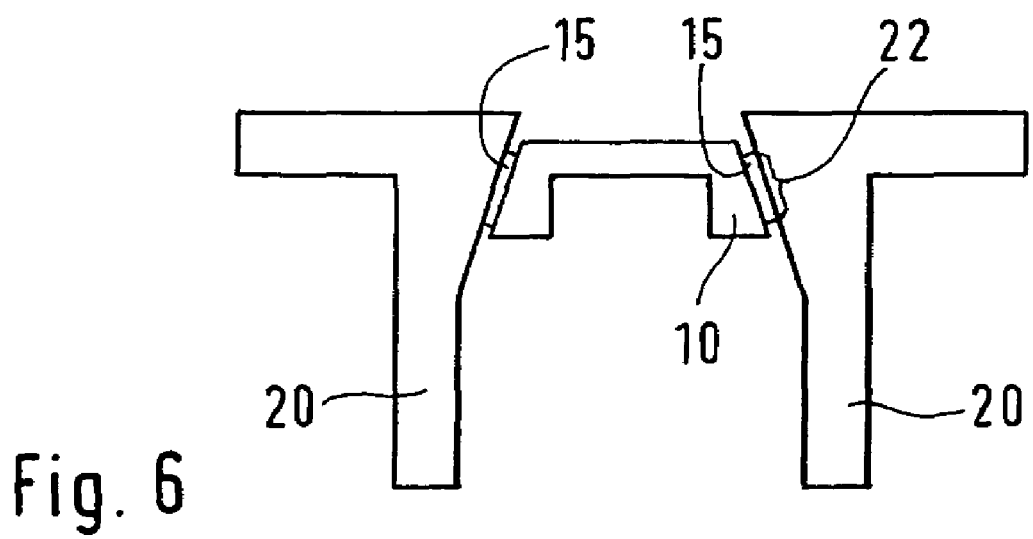
FIG. 6 shows a second design variant of the sensor according to the exemplary embodiment of the present invention.

FIGS. 5 and 6 show variants of a pressure sensor according to the exemplary embodiment of the present invention. As a first variant (shown in FIG. 5), sensor chip 10 may be assembled without a notch, i.e., without projection 17 as shown in FIG. 2. In this case, first fixing area 14 is situated at the edge of sensor chip 10 alongside diaphragm area 12 on the front of sensor chip 10. In this case, the socket may have a slanting guide which facilitates the centric assembly of pressure sensor chip 10.

In a second variant of the pressure sensor according to the exemplary embodiment of the present invention (shown in FIG. 6), sensor chip 10, having a beveled saw angle, is manufactured using a special saw blade, thereby allowing self-centered chip assembly. This results in the fact that the connecting surface between first fixing area 14 and second fixing area 22 is inclined with respect to the plane of the diaphragm of sensor chip 10, i.e., forming an acute angle.

According to the circumstances in FIGS. 2, 3, and 5, the mentioned connecting surface is parallel to the plane of the diaphragm of sensor chip 10.

In both variants of the pressure sensor according to the exemplary embodiment of the present invention, the backside of socket 20 is provided in such a way that the cross section of socket 20 tapers in the direction of second fixing area 22, thereby making the mentioned centric assembly of pressure sensor chip 10 possible.

What id claimed is:

1. A pressure sensor comprising:
    a pressure sensor element having a diaphragm area; and
    a first fixing area, a pressure to be measured exerting a force action on the diaphragm area, the first fixing area being connected to a second fixing area of a fixing element to fix the pressure sensor element;
    wherein the first fixing area and the second fixing area are pressure-loaded by the force action, and
    wherein a cross section of the fixing element tapers, at the second fixing area, at an angle to a sensing plane of the diaphragm area.

2. The pressure sensor of claim 1, wherein the pressure sensor element is at least one of made of a semiconductor material and is manufactured using bulk micromechanics.

3. The pressure sensor of claim 1, wherein the pressure sensor handles high pressures, including pressures up to approximately 1,000 bar.

4. The pressure sensor of claim 1, wherein the pressure sensor handles pressures exceeding 1,000 bar.

5. The pressure sensor of claim 1, wherein the fixing element, with respect to its coefficient of thermal expansion, is adapted to the sensor element.

6. The pressure sensor of claim 1, wherein a connecting material is between the first fixing area and the second fixing area, the connecting material being comparatively soft.

7. The pressure sensor of claim 1, wherein resistor elements are provided in the diaphragm area.

8. The pressure sensor of claim 1, wherein a connecting surface between the first fixing area and the second fixing area is at an acute angle to the sensing plane of the dianhramn area.

9. The pressure sensor of claim 1, wherein the tapering of the cross section of the fixing element at the second fixing area centers the pressure sensor element in the fixing element under the force action of the measured pressure.

10. The pressure sensor of claim 1, wherein the pressure sensor has an angled edge at the first fixing area which substantially conforms to the taper of the cross section of the fixing element at the second fixing area.

11. The pressure sensor of claim 1, wherein the diaphragm area is formed as a wall of a cavity in the pressure sensor element, the cavity having additional walls adjacent to the diaphragm area and at an angle of substantially 90° to the diaphragm area.

12. The pressure sensor of claim 11, wherein the pressure sensor element comprises silicon and the fixing element comprises Kovar.

* * * * *